United States Patent [19]

Green et al.

[11] 4,368,253
[45] Jan. 11, 1983

[54] IMAGE FORMATION PROCESS

[75] Inventors: George E. Green, Stapleford; John S. Waterhouse, Cherry Hinton, both of England

[73] Assignee: Ciba-Geigy Corporation, Ardsley, N.Y.

[21] Appl. No.: 340,670

[22] Filed: Jan. 19, 1982

[30] Foreign Application Priority Data

Jan. 28, 1981 [GB] United Kingdom ............... 8102847

[51] Int. Cl.$^3$ .............................................. G03C 5/00
[52] U.S. Cl. .................................. 430/326; 430/281; 430/905; 430/906; 430/908; 430/311; 430/923; 204/159.14; 204/159.15; 204/159.19
[58] Field of Search ............... 430/281, 916, 923, 270, 430/311, 326, 905, 906, 908; 204/159.14, 159.15, 159.18, 159.19

[56] References Cited

U.S. PATENT DOCUMENTS

| | | |
|---|---|---|
| 3,728,377 | 4/1973 | Kelly et al. |
| 3,801,329 | 4/1974 | Sandner et al. ................ 430/923 |
| 4,001,216 | 1/1977 | Winkley et al. |
| 4,009,040 | 2/1977 | Nebe |
| 4,029,505 | 6/1977 | Nebe ............................ 430/326 |
| 4,086,210 | 4/1978 | Petropoulos |
| 4,318,791 | 3/1982 | Felder et al. ................... 430/281 |

FOREIGN PATENT DOCUMENTS 1330100 9/1973 United Kingdom.

OTHER PUBLICATIONS

S. A. MacDonald et al., ACS Org. Coat & Plast. Preprints, 43, 264, (1980).
J. P. Yardley et al., Synthesis, 1976, 244.
N. J. Leonard et al., J. Am. Chem. Soc., 71, 2997, (1949), CA, 59, 13857, (1963).

Primary Examiner—Jack P. Brammer
Attorney, Agent, or Firm—Luther A. R. Hall

[57] ABSTRACT

A method for forming an image by a positive resist process comprises:
(1) exposing imagewise to actinic radiation a photoresist composition comprising:
(a) a film-forming organic material having at least one substituted benzoin group of formula:

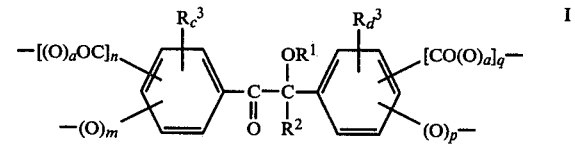

where $R^1$ denotes a hydrogen atom, an alkyl, cycloalkyl, cycloalkylalkyl, or aralkyl group or a group —$(CH_2)_b X$; $R^2$ denotes a hydrogen atom or an alkyl, cycloalkyl, cycloalkylalkyl, aryl or aralkyl group; $R^3$ denotes a halogen atom or an alkyl, alkoxy, cycloalkyl, cycloalkylalkyl or phenyl group; X denotes a halogen atom, an alkoxy group, a phenoxy group, a group —$COOR^4$ or a group —$OOCR^4$, where $R^4$ denotes an alkyl group; a denotes zero or 1; b denotes an integer of from 1 to 4; m and n each denote zero or 1, the sum of m+n being 1; p and q each denote zero or 1, the sum of p+q being 1; and c and d each denote zero or an integer of from 1 to 3; and
(b) a compound which is polymerizable under the influence of a free radical catalyst to form a higher molecular weight material which is more soluble in a developer than the composition prior to exposure, so that the solubility of the composition in a developer is increased in the exposed portion; and
(2) treating the composition with a developer to remove the exposed portion.

16 Claims, No Drawings

IMAGE FORMATION PROCESS

BACKGROUND OF THE INVENTION

This invention relates to a process for the formation of an image using a positive photoresist and to supports bearing an image produced by this process.

In the production of an image using a positive photoresist, portions of the resist which are exposed to actinic radiation are rendered more soluble or more easily removable than the unexposed portions. The exposed portions can consequently be removed with a developer, leaving the unexposed portions intact, to form a positive image. Such image-forming processes are useful, for example, in the manufacture of printing plates and printed circuits.

Commercially available positive photoresists based on materials containing quinone diazides are not heat-stable. Furthermore, in the manufacture of printed circuits, they are not suitable for use both as a resist and as a dielectric material. For instance, in the manufacture of multilayer circuits using positive resists, it is desirable that the unexposed resist should be a good dielectric material so that there is no need to remove the resist before assembly of the layers. The commercially available positive resists are not suitable dielectric materials for use in such circuits.

Positive photoresists comprising polymers which depolymerise or photolyse on exposure to actinic radiation are known. For instance, U.S. Pat. No. 4,009,040 describes positive photoresists comprising depolymerisable condensation polymers containing hexa-arylbiimidazole groups. A paper by S. A. MacDonald, T. D. Schierling and C. G. Wilson, Organic Coatings and Plastics Chemistry Preprints (Amer. Chem. Soc.), 1980, 43, 264–7, describes photodegradable condensation polymers containing N-allyl-o-nitroaryl amide groups.

We have surprisingly found that resins or polymers containing certain substituted benzoin groups, although they show no increase in solubility when irradiated alone, become more soluble in a developer when irradiated in admixture with a monomer which is polymerisable under the influence of a free radical catalyst to form a higher molecular weight material which is more soluble in the developer than the mixture before irradiation. Such mixtures may therefore be used as positive photoresists. These resists are heat-stable. Furthermore, when the unexposed resin or polymer is heat-curable, the resist may be used in the manufacture of multilayer printed circuits without the need to remove the unexposed portion prior to bonding of the layers.

SUMMARY OF THE INVENTION

The present invention provides a process for the formation of an image which comprises:

(1) exposing imagewise to actinic radiation a photoresist composition comprising:

(a) a film-forming organic material having at least one substituted benzoin group of formula:

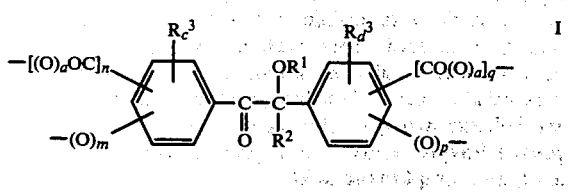

where:

$R^1$ denotes a hydrogen atom, an alkyl, cycloalkyl, cycloalkylalkyl, or aralkyl group or a group —$(CH_2)_bX$, $R^2$ denotes a hydrogen atom or an alkyl, cycloalkyl, cycloalkylalkyl, aryl or aralkyl group, $R^3$ denotes a halogen atom or an alkyl, alkoxy, cycloalkyl, cycloalkylalkyl or phenyl group, X denotes a halogen atom, an alkoxy group, a phenoxy group, a group —$COOR^4$ or a group —$OOCR^4$, $R^4$ denotes an alkyl group, a denotes zero or 1, b denotes an integer of from 1 to 4, m denotes zero or 1, n denotes zero or 1, the sum of m+n being 1, p denotes zero or 1, q denotes zero or 1, the sum of p+q being 1, c denotes zero or an integer of from 1 to 3, and d denotes zero or an integer of from 1 to 3; and (b) a compound which is polymerisable under the influence of a free radical catalyst to form a higher molecular weight material which is more soluble in a developer than the composition prior to exposure, so that the solubility of the composition in a developer is increased in the exposed portion; and (2) treating the composition with a developer to remove the exposed portion.

In formula I, $R^1$ generally denotes a hydrogen atom, an alkyl group of 1 to 12, preferably 1 to 6, carbon atoms, a cycloalkyl group of 3 to 8 carbon atoms, a cycloalkylalkyl group of 4 to 10 carbon atoms, an aralkyl group of 7 to 16, preferably 7 to 10, carbon atoms, or a group —$(CH_2)_bX$ where X denotes a halogen atom, preferably a chlorine or bromine atom, an alkoxy group of 1 to 4 carbon atoms, preferably a methoxy group, a phenoxy group, a group —$COOR^4$ or a group —$OOCR^4$ where $R^4$ denotes an alkyl group of 1 to 4 carbon atoms and b denotes an integer of from 1 to 3. In especially preferred embodiments, $R^1$ denotes a hydrogen atom or an alkyl group of 1 to 4 carbon atoms.

$R^2$ generally denotes a hydrogen atom, an alkyl group of 1 to 12, preferably 1 to 6, carbon atoms, a cycloalkyl group of 3 to 8 carbon atoms, a cycloalkylalkyl group of 4 to 10 carbon atoms, an aralkyl group of 7 to 16 carbon atoms, or an aryl group of 6 to 12 carbon atoms. In particularly preferred embodiments, $R^2$ denotes a hydrogen atom or an alkyl group of 1 to 4 carbon atoms.

When $R^3$ is present, it generally denotes a halogen atom, preferably a chlorine or bromine atom, an alkyl group of 1 to 4 carbon atoms, a cycloalkyl group of 3 to 8 carbon atoms, a phenyl group or an alkoxy group of 1 to 4 carbon atoms. Preferably, there is no more than one substituent $R^3$ on each of the indicated rings. More preferably, there are no substituents $R^3$ on the rings, that is, c and d each denote zero.

The indicated oxygen atoms and carbonyl(oxy) groups attached to the aromatic rings in formula I may be attached at positions ortho or meta to the ring carbon atoms linked to the acyloin bridge, but are preferably attached at positions para to those atoms.

Particularly preferred units of formula I are those where $R^1$ is a hydrogen atom or an alkyl group of 1 to 4 carbon atoms, $R^2$ is a hydrogen atom, and c and d each denote zero.

The film-forming material (a) should preferably contain at least three groups of formula I. Within this requirement, the number of such groups can vary over a wide range depending on the nature and molecular weight of the material (a). For example, a polymer suitable for use as (a) may contain up to 200 such groups.

Film-forming resins or polymers containing one or more groups of formula I may be prepared by reacting a compound of formula:

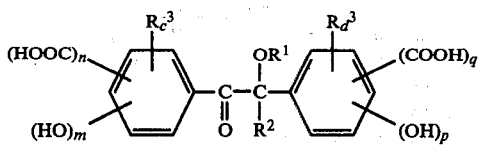

where the symbols have the meanings previously assigned, with a compound having 2 groups reactive with the indicated carboxyl or phenolic hydroxyl groups. Polyurethanes containing groups of formula I (where n and q each denote zero) may be obtained by reacting a compound of formula II, where m and p each denote 1 and n and q each denote zero, with a di-isocyanate such as toluene di-isocyanate. Polyamides containing groups of formula I (where n and q each denote 1 and a denotes zero) may be obtained by reacting a compound of formula II, where n and q each denote 1 and m and p each denote zero, with a diamine such as hexamethylenediamine. Polycarbonates can be obtained by reacting a compound of formula II, where it is a bisphenol, with diphenyl carbonate. Polysulphones can be obtained from a compound of formula II, where it is a bisphenol, by reacting its sodium salt with 4,4′-dichlorodiphenyl sulphone. Phenoxy resins can be prepared by reacting a bisphenol of formula II with a stoichiometric deficiency of an epoxide resin.

Film-forming resins or polymers containing one or more units of formula I may also be prepared by reacting a compound of formula II with a monoepoxide, for example, an alkylene oxide such as ethylene oxide or propylene oxide, to etherify the indicated phenolic hydroxyl group(s) and/or esterify the indicated carboxyl group(s), thereby introducing 2 alcoholic hydroxyl groups, and reacting the product with a compound having 2 groups reactive with the alcoholic hydroxyl groups, for example a di-isocyanate or a dicarboxylic acid.

Preferred film-forming materials having at least one group of formula I for use in the process of this invention are epoxide resins, polyesters, and polyurethanes.

Suitable epoxide resins having one or more groups of formula I include diglycidyl ethers obtained by reacting a compound of formula II, where m and p each denote 1, with epichlorohydrin or glycerol dichlorohydrin under alkaline conditions or in the presence of an acidic catalyst followed by treatment with alkali. Other suitable epoxide resins may be diglycidyl esters obtained by reacting a compound of formula II, where n and q each denote 1, with epichlorohydrin or glycerol dichlorohydrin in the presence of an alkali. Further epoxide resins which may be used in the process of the invention are mixed glycidyl ether-glycidyl ester resins obtained by reacting a compound of formula II, where either m and q each denote 1 or n and p each denote 1, with epichlorohydrin or glycerol dichlorohydrin in the presence of an alkali. Other epoxide resins which can be used are diglycidyl ethers of the alcohols obtained by reaction of a compound of formula II with a monoepoxide as already described.

Suitable epoxide resins having one or more units of formula I are also obtained by an addition reaction of a diglycidyl ether, diglycidyl ester or mixed glycidyl ether-glycidyl ester prepared as described above with a stoichiometric deficiency of a difunctional compound having two groups which react with the epoxide groups of the abovementioned glycidyl derivatives to form epoxide resins of higher molecular weight. This addition reaction, otherwise conventionally known as an advancement reaction, may be carried out in the presence, as catalyst, of a base or a quaternary ammonium salt. Typical difunctional compounds used in advancement reactions include bisphenols such as bisphenol A (i.e., 2,2-bis(4-hydroxyphenyl)propane), mononuclear dihydric phenols such as resorcinol, dicarboxylic acids such as hexahydrophthalic acid, and hydantoins such as 5,5-dimethylhydantoin.

Preferred epoxide resins for use as component (a) in the process of the invention are those of formula:

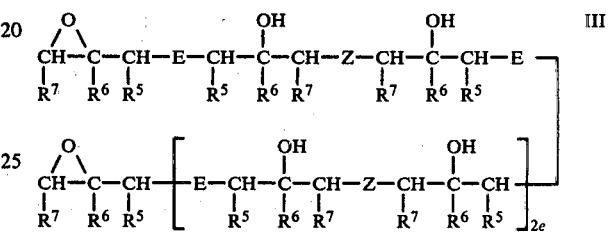

where E denotes the residue of a diepoxide after removal of two groups of formula:

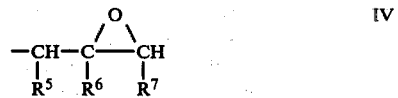

the residue being linked through oxygen, nitrogen or sulphur atoms to the indicated carbon atoms, Z denotes a group of formula I where a denotes 1, either $R^5$ and $R^7$ each denote a hydrogen atom, in which case $R^6$ denotes a hydrogen atom or a methyl group, or $R^5$ and $R^7$ together represent —$CH_2CH_2$—, in which case $R^6$ denotes a hydrogen atom, and e denotes zero or an integer of from 1 to 50.

Resins of formula III can be obtained by advancement of a compound of formula II with a stoichiometric excess of a polyepoxide having, per average molecule, more than 1 but not more than 2 groups of formula IV directly attached to oxygen, nitrogen or sulphur atoms. In general, from 0.75 to 1 phenolic hydroxyl and/or carboxyl equivalent of the compound of formula II is used per 1,2-epoxide group in the polyepoxide.

As examples of such polyepoxides may be mentioned polyglycidyl and poly($\beta$-methylglycidyl) esters obtainable by reaction of a compound containing two carboxylic acid groups per molecule with epichlorohydrin, glycerol dichlorohydrin, or $\beta$-methylepichlorohydrin in the presence of an alkali. Such polyglycidyl esters may be derived from aliphatic polycarboxylic acids, e.g., succinic acid, glutaric acid, adipic acid, pimelic acid, suberic acid, azelaic acid, sebacic acid, or dimerised linoleic acid; from cycloaliphatic polycarboxylic acids such as tetrahydrophthalic acid, 4-methyltetrahydrophthalic acid, hexahydrophthalic acid, and 4-methylhexahydrophthalic acid; and from aromatic polycarboxylic acids such as phthalic acid, isophthalic acid, and terephthalic acid.

Further examples are polyglycidyl and poly(β-methylglycidyl) ethers obtainable by reaction of a compound containing two free alcoholic hydroxyl or phenolic hydroxyl groups per molecule with the appropriate epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene) glycols, propane-1,3-diol, poly(oxytetramethylene) glycols, and pentane-1,5-diol; from cycloaliphatic alcohols such as resorcitol, quinitol, bis(4-hydroxycyclohexyl)methane, 2,2-bis(4-hydroxycyclohexyl)propane, and 1,1-bis(hydroxymethyl)cyclohex-3-ene; and from alcohols having aromatic nuclei, such as N,N-bis(2-hydroxyethyl)aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane (otherwise known as bisphenol F), 4,4'-dihydroxydiphenyl, bis(4-hydroxyphenyl) sulphone, 2,2-bis(4-hydroxyphenyl)propane, and 2,2-bis(3,5-dibromo-4-hydroxyphenyl)propane.

Poly(N-glycidyl) compounds may also be used, e.g., N-glycidyl derivatives of amines such as aniline, n-butylamine, bis(4-aminophenyl)methane, and bis(4-methylaminophenyl)methane; and N,N'-diglycidyl derivatives of cyclic alkyleneureas, such as ethyleneurea and 1,3-propyleneurea, and of hydantoins such as 5,5'-dimethylhydantoin.

Poly(S-glycidyl) compounds may also be used, e.g., di(S-glycidyl) derivatives of dithiols such as ethane-1,2-dithiol and bis(4-mercaptomethylphenyl) ether, but they are not preferred.

Examples of polyepoxides having groups of formula IV where $R^5$ and $R^7$ conjointly denote a —$CH_2CH_2$— group are bis(2,3-epoxycyclopentyl) ether, 2,3-epoxycyclopentyl glycidyl ether, and 1,2-bis(2,3-epoxycyclopentyloxy)ethane.

Polyepoxides having the 1,2-epoxide groups attached to different kinds of hetero atoms may be employed, e.g., the glycidyl ether-glycidyl ester of salicylic acid.

Polyepoxides in which some or all of the epoxide groups are not terminal may also be employed, such as vinylcyclohexene dioxide, limonene dioxide, dicyclopentadiene dioxide, 4-oxatetracyclo[6.2.1.0$^{2,7}$.0.$^{3,5}$]undec-9-yl glycidyl ether, 1,2-bis(4-oxatetracyclo[6.2.1.0$^{2,7}$.0.$^{3,5}$]undec-9-yloxy)ethane, 3,4-epoxycyclohexylmethyl 3',4'-epoxycyclohexanecarboxylate and its 6,6'-dimethyl derivative, ethylene glycol bis(3,4-epoxycyclohexanecarboxylate, and 3-(3,4-epoxycyclohexyl)-8,9-epoxy-2,4-dioxaspiro[5,5]undecane.

If desired, a mixture of polyepoxides may be used.

Especially preferred epoxide resins used in this invention are those of formula III where E denotes the residue of a diglycidyl ether of a dihydric phenol such as 2,2-bis(4-hydroxyphenyl)propane and bis(4-hydroxyphenyl)methane or of a dihydric aliphatic alcohol such as butane-1,4-diol, or the residue of a di(N-glycidyl) derivative of a hydantoin.

The reaction of the compound of formula II with the polyepoxide is preferably carried out in solution in an organic solvent and in the presence of a catalyst which may be a tertiary amine such as N-benzyldimethylamine or a quaternary ammonium salt such as tetramethylammonium chloride.

Polyesters having one or more groups of formula I may be obtained by reacting a compound of formula II, where it is a bisphenol (that is, where m and p each denote 1), with a dicarboxylic acid or an ester-forming derivative thereof such as a halide, anhydride, amide, or lower alkyl ester thereof (by "lower alkyl" is meant alkyl of 1 to 4 carbon atoms). As examples of such dicarboxylic acid reactants may be mentioned aliphatic diacids such as succinic, glutaric, adipic, or sebacic acids, cycloaliphatic diacids such as hexahydrophthalic and hexahydroterephthalic acids, aromatic diacids such as phthalic and terephthalic acids, and ester-forming derivatives of these diacids.

Other suitable polyesters may be obtained by reacting a compound of formula II, where it is a diacid (that is, where n and q each denote 1), or an ester-forming derivative thereof, such as a halide, anhydride, amide, or lower alkyl ester thereof, with a dihydric alcohol or a dihydric phenol. As examples of dihydric alcohols may be mentioned ethylene glycol, diethylene glycol, triethylene glycol, propylene glycol, dipropylene glycol, propane-1,3-diol, butane-1,4-diol, hexane-1,6-diol, quinitol, bis(4-hydroxycyclohexyl)methane, and 2,2-bis(4-hydroxycyclohexyl)propane. As examples of dihydric phenols may be mentioned resorcinol, bis(4-hydroxyphenyl)methane, 4,4'-dihydroxybiphenyl, bis(4-hydroxyphenyl) sulphone, and 2,2-bis(4-hydroxyphenyl)propane.

The polyester-forming reaction between the dihydric phenol or dihydric alcohol and the diacid or ester-forming derivative thereof is preferably carried out in solution in an organic solvent using a conventional catalyst such as a tertiary amine, or, when the ester-forming derivative is a lower alkyl ester, in the presence of a transesterification catalyst. The reactants are used in amounts such that a polyester having from 1 to 200, preferably from 3 to 100, benzoin units is obtained. Usually from 0.75 to 1.25 moles of dihydric phenol or dihydric alcohol is used per mole of diacid.

Preferred polyesters are those obtained by reacting a compound of formula II, where m and p each denote 1, with an aliphatic dicarboxylic acid or an ester-forming derivative, especially an acyl chloride, thereof, or by reaction of a dilower alkyl ester of a compound of formula II, where n and q each denote 1, with a dihydric alcohol.

Polyurethanes having one or more groups of formula II may be obtained by reacting a bisphenol of formula II with an aliphatic, cycloaliphatic, aromatic, araliphatic, or heterocyclic di-isocyanate or a prepolymer thereof. Examples of such di-isocyanates include 1,6-di-isocyanatohexane and its 2,2,4- and 2,4,4-trimethyl homologues, 2,4- and 2,6-di-isocyanatotoluene, 1,5-di-isocyanatonaphthalene, bis(4-isocyanatophenyl)methane, 2,4- and 2,6-di-isocyanatomethylcyclohexane, and 3-isocyanatomethyl-3,5-5-trimethylcyclohexyl isocyanate.

In the preparation of polymers such as polyesters or polyurethanes from a compound of formula II, or an adduct thereof with a monoepoxide, as the hydroxyl compound, it is preferred that $R^1$ should be other than a hydrogen atom, i.e., it is preferred that the compound of formula II should contain only two hydroxyl groups. This obviates the need to carry out the polymer-forming reaction under carefully controlled conditions to avoid extensive crosslinking.

Polyesters containing groups of formula I are described as photoinitiators in U.S. Pat. No. 3,728,377.

Epoxide resins (and the other specified resins or polymers) containing one or more such groups, and consequently compositions containing them together with a compound (b), are believed to be new.

Compounds of formula II, where m and p each denote 1 and $R^1$ and $R^2$ each denote a hydrogen atom, can be obtained by the following procedure. A hydroxy-substituted benzaldehyde, optionally having one or more further substituents $R^3$, or a mixture of such hydroxy-substituted benzaldehydes, is reacted with dimethoxymethane using the method described by J. P. Yardley and H. Fletcher (Synthesis, 1976, 244) to convert the phenolic hydroxyl group(s) into methoxymethoxy groups. The product is subjected to a benzoin condensation to form a dimethoxymethoxybenzoin. The protecting methoxymethyl groups are then removed by reaction with a mineral acid to form a dihydroxybenzoin. Such compounds can also be obtained from the corresponding dihydroxybenzils. A dihydroxybenzil is prepared, using the method described by N. J. Leonard et al. (J. Amer. Chem. Soc., 1949, 71, 2997), by subjecting a methoxybenzaldehyde, optionally having one or more substituents $R^3$, or a mixture of such methoxybenzaldehydes, to a benzoin condensation, oxidising the resulting dimethoxybenzoin to form the corresponding benzil, and treating the benzil with hydrobromic acid to cleave the methoxy groups. The resulting dihydroxybenzil is reduced using tin and hydrochloric acid to give a dihydroxybenzoin.

Compounds of formula II where m and p each denote 1, $R^1$ denotes one of the specified organic groups and $R^2$ denotes a hydrogen atom may be prepared by reacting a dihydroxybenzoin, prepared as described above, with an alcohol $R^1OH$ in the presence of an acid catalyst such as toluene-4-sulphonic acid.

Compounds of formula II where n and q each denote 1 and $R^1$ and $R^2$ each denote a hydrogen atom can be prepared by subjecting a carbalkoxybenzaldehyde, optionally having one or more substituents $R^3$, or a mixture of such carbalkoxybenzaldehydes, to a benzoin condensation as described in U.S. Pat. No. 3,728,377 to form a dicarbalkoxybenzoin, and hydrolysing the ester groups by means of an acid or alkali to give a dicarboxybenzoin.

Compounds of formula II where n and q each denote 1, $R^1$ denotes one of the specified organic groups, and $R^2$ denotes a hydrogen atom may be obtained by reaction of dicarbalkoxybenzoin, prepared as described above, with an alcohol $R^1OH$ in the presence of an acid catalyst, followed by acid or alkaline hydrolysis of the ester groups.

Compounds of formula II where one of m and p denotes 1, one of n and q denotes 1, and $R^1$ and $R^2$ each denote a hydrogen atom may be obtained by subjecting to a benzoin condensation a mixture of a methoxymethoxy-substituted benzaldehyde, prepared as described above, and a carbalkoxybenzaldehyde to form a methoxymethoxycarbalkoxybenzoin followed by reaction of the latter with a mineral acid to hydrolyse the ether group and ester group and form a hydroxycarboxybenzoin.

Compounds of formula II where one of m and p denotes 1, one of n and q denotes 1, $R^1$ denotes one of the specified organic groups, and $R^2$ denotes a hydrogen atom may be prepared by reacting a hydrocarboxybenzoin, prepared as described above, with an alcohol $R^1OH$ in the presence of an acid catalyst, resulting in etherification of the hydroxyl group on the carbon atom alpha to the carbonyl group accompanied by esterification of the carboxyl group attached to the ring, and then hydrolysing the ester group to reconvert it into a carboxyl group.

Compounds of formula II where $R^1$ is a hydrogen atom and $R^2$ is one of the specified organic groups may be obtained by reacting a dimethoxymethoxybenzoin, a dicarbalkoxybenzoin, or a methoxymethoxycarbalkoxybenzoin, all prepared as described above, with sodium methoxide to form the sodium derivative, reacting the latter with a halide $R^2Y$ where Y is a halogen atom, for example methyl iodide, tert.-butyl bromide, or benzyl bromide, to form the corresponding α-substituted benzoin, and then hydrolysing the methoxymethoxy groups and/or ester groups respectively as described above.

Compounds of formula II where m and p each denote 1, $R^1$ is a hydrogen atom and $R^2$ is one of the specified organic groups may also be obtained by reaction of a dimethoxymethoxybenzil, prepared by oxidation of the corresponding dimethoxymethoxybenzoin, with a Grignard reagent, to form the corresponding alpha-substituted dimethoxymethoxybenzoin, followed by removal of the methoxymethyl groups as described above.

Compounds of formula II where $R^1$ is one of the specified organic groups and $R^2$ is one of the specified organic groups may be obtained by reaction of the corresponding compounds where $R^1$ is a hydrogen atom with an alcohol $R^1OH$ in the presence of an acid catalyst, followed where appropriate by hydrolysis of the ester group(s) attached to the ring(s).

The polymerisable compound (b) is a compound which is transformed under the influence of a free radical catalyst into a higher molecular weight material which is more soluble in a developer than the resist composition prior to exposure. For example, the compound (b) may contain a functional group which renders the higher molecular weight material soluble in a solvent in which the resist composition is insoluble. It is believed, although the utility of the invention does not depend upon the truth of this belief, that the material (a) photolyses on exposure to actinic radiation to produce fragments which are free radicals which initiate polymerisation of compound (b) and that the higher molecular weight material formed as a result is attached to the fragments of material (a) produced by photolysis.

Preferably, the compound (b) contains one or more functional groups such that it is polymerisable to form a higher molecular weight material which is soluble in aqueous solvents, especially basic or acidic solutions, so that the exposed portion of the resist is soluble in an aqueous developer, for example, an aqueous alkaline developer such as an aqueous solution of sodium hydroxide, sodium carbonate, or disodium hydrogen phosphate, or an aqueous acidic developer such as an aqueous solution of a mineral acid.

Functional groups which impart solubility in aqueous alkaline solutions include sulphonic acid groups, and especially, carboxyl groups. Thus compound (b) may be a compound having an ethylenically unsaturated group and a sulphonic acid group, for example, vinylsulphonic acid. Preferably (b) is a compound having an ethylenically unsaturated group and one or more carboxyl groups. As examples of such compounds may be mentioned crotonic acid, 3-butenoic acid, itaconic acid, maleic acid and fumaric acid.

Preferred ethylenically unsaturated carboxyl compounds are those containing an ethylenically unsaturated ester group and one or more carboxyl groups. The ester group may be, for example, a crotonoyloxy group, an itaconoyloxy group or, especially, an acryloyloxy or methacryloyloxy group. Such compounds may be of formula:

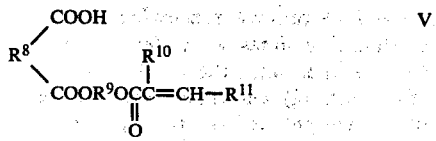

where:

$R^8$ denotes a divalent organic group attached via carbon atoms to the carbon atoms of the indicated carbonyl groups, $R^9$ denotes an alkylene group, optionally interrupted by one or more oxygen atoms in the chain, $R^{10}$ denotes a hydrogen atom, a halogen atom or an alkyl group of 1 to 4 carbon atoms, and $R^{11}$ denotes a hydrogen atom or an alkyl group of 1 to 3 carbon atoms.

Preferably, $R^8$ denotes an alkylene group of 1 to 4 carbon atoms, a cycloalkylene group of 4 to 8 carbon atoms or an arylene group of 6 to 12 carbon atoms, the alkylene, cycloalkylene, or arylene group optionally being substituted by one or more carboxyl groups.

$R^9$ preferably denotes an alkylene group having 2 to 6 carbon atoms, and $R^{10}$ and $R^{11}$ preferably each denote a hydrogen atom or a methyl group.

Compounds of formula V may be prepared by reaction of a polycarboxylic acid anhydride of formula:

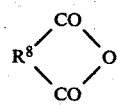

with a hydroxyalkyl ester of formula:

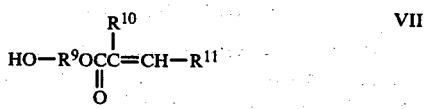

where $R^8$, $R^9$, $R^{10}$, and $R^{11}$ have the meanings assigned above.

The reaction is usually carried out, using from 0.8 to 1.2 moles of the anhydride per mole of the hydroxyalkyl ester, in an organic solvent in the presence of a tertiary amine catalyst and a polymerisation inhibitor. Especially preferred polycarboxylic acid anhydrides are succinic, phthalic, and trimellitic anhydrides. The especially preferred hydroxyalkyl ester is 2-hydroxyethyl acrylate.

Functional groups which impart solubility in aqueous acid solutions include amino groups. Thus, compound (b) may be a compound having an ethylenically unsaturated group and one or more amino groups, particularly secondary or tertiary amino groups. As examples of such compounds may be mentioned alkylaminoalkyl acrylates or methacrylates, such as 2-(tert.-butylamino)ethyl methacrylate, dialkylaminoalkyl acrylates and methacrylates, such as 2-(dimethylamino)ethyl methacrylate and 2-(diethylamino)ethyl acrylate, and vinylpyridines such as 2-vinylpyridine, 4-vinylpyridine, and 2-methyl-5-vinylpyridine.

A mixture of two or more polymerisable compounds (b) each having a solubilising functional group may be included in the photoresist composition. Similarly, a mixture of a polymerisable compound (b) having such a functional group and a copolymerisable monomer lacking such a group may be used.

The relative amounts of (a) and (b) in the photoresist composition may vary according to the molecular weight of (a), that is, according to the number of groups of formula I in (a). In general, at least 1 mole of (b) is used per group of formula I in (a). It will be apparent that the amount of (b) should not be so great as to render the composition prior to exposure soluble in the chosen developer or to prevent the formation of a suitable film on a support.

When an epoxide resin is used as the film-forming material (a), the resist composition may also contain a latent, heat-activated crosslinking agent for the resin, so that after exposure to actinic radiation and development of the image the unexposed portion of the resist may be crosslinked by heating. Suitable heat-activated agents include polycarboxylic acid anhydrides, complexes of amines, especially primary or tertiary aliphatic amines such as ethylamine, trimethylamine, and n-octyldimethylamine, with boron trifluoride or boron trichloride, aromatic polyamines, imidazoles, 2,6-xylylbiguanide, and dicyandiamide. When the polymerisable compound (b) contains two or more functional groups reactive with epoxide groups at elevated temperatures, such as carboxyl groups, it may be unnecessary to add a further heat-activated crosslinking agent.

In carrying out the process of this invention, a layer of the resist composition may be applied to a support by coating the support with a solution of the composition in a convenient solvent, for example, cyclohexanone, 2-ethoxyethanol, ethyl methyl ketone, N-methylpyrrolidone, or mixtures thereof, and allowing or causing the solvent to evaporate. The layer may be applied by dipping, spinning, spraying, or by means of a roller. The support may be of, for example, copper, aluminium or other metal, paper, synthetic resin, or glass. The support should be coated so that the layer, upon drying, has a thickness in the range from about 1 to 250 μm. The solvent may be removed by air drying, by heating (to a temperature below that at which any heat-curable component is cured), or by any other known drying technique. The coated support may then be stored until required for use. In some instances it may be desirable to leave the layer with some residual tackiness, in order to increase its sensitivity.

Imagewise exposure is usually carried out by exposing the layer of resist composition to actinic radiation through an image-bearing transparency consisting of substantially opaque and substantially transparent areas. Actinic radiation of wavelength 200 to 600 nm is generally used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The exposure time required depends on a variety of factors including, for example, the nature of the individual material (a) being used, the thickness of the layer, the type of radiation source and its distance from the layer; it may vary from a few seconds to about 20 minutes. The distance between the light source and the photoresist layer is usually from about 3 cm to about 50 cm.

Subsequent to its imagewise exposure, the photoresist layer is washed with a developer to remove the exposed portion, that is the portion stuck by radiation, and leave the unexposed portion. Thus a positive image is obtained. As indicated above, the polymerisable compound (b) used in the photoresist layer is preferably one which renders the exposed portion soluble in an aqueous developer.

Subsequent treatment of the image-bearing support depends on the application in which it is being used. As already indicated, when a heat-curable resin is used as the material (a), especially an epoxide resin together with a heat-activated curing agent therefor, the unexposed portion of the photoresist layer may be cured by heating to enhance its adhesion to the support.

The process of this invention is useful in the production of printing plates and printed, integrated, and hybrid circuits.

When the photoresist layer contains an epoxide resin, it is of particular value in the production of multilayer printed circuits.

Conventionally, a multilayer printed circuit is prepared from several double-sided printed circuit boards of copper, stacked one on top of another and separated from each other by insulating sheets, usually of glass fibre impregnated with an epoxide resin or a phenol-formaldehyde resin in the B-stage. If a heat-curing agent is not included in the photoresist layer in the circuit board, it can be incorporated in the insulating layers which alternate with the plates, these layers conveniently being of an epoxide resin or phenol-formaldehyde resin prepreg; sufficient of the heat-curing agent contained in the prepreg, providing the latter is not too thick, migrates to induce crosslinking of the epoxide resin in the unexposed portion of the photoresist layer. The stack is heated and compressed to bond the layers together.

The presence of residual crosslinking groups in the compositions of this invention means that crosslinking can occur when the boards are bonded, resulting in good adhesion to the copper and to the resin-impregnated glass fibre substrate, so avoiding the necessity of removing the photoresist layer prior to bonding the boards together.

The invention is illustrated by the following Examples. Unless otherwise indicated, parts are by weight.

Starting materials used in the Examples were prepared as follows. Temperatures are in degrees Celsius. Thin layer chromatography was carried out on silica, using a mixture of 80:20 by volume of diethyl ether and light petroleum ether (b.pt. 40°–60°) as eluant.

4,4'-Dihydroxybenzoin n-butyl ether 4,4'-Dihydroxybenzoin was made by either of two procedures and then butylated at the alcoholic hydroxyl group.

Procedure I (a) 4-(Methoxymethoxy)benzaldehyde

This was prepared by the method of Yardley and Fletcher (Synthesis, 1976, 244):

A suspension of 4-hydroxybenzaldehyde (55 g) and toluene-4-sulphonic acid (1.0 g) was stirred at reflux in a mixture of dichloromethane (500 ml) and dimethoxymethane (250 ml) under a Soxhlet extraction apparatus containing Type 3A molecular sieve (100 g). After 2 hours' reflux the molecular sieve was replaced with a fresh batch, and more toluene-4-sulphonic acid (1.0 g) was added to the reaction mixture. After 48 hour's reflux, the molecular sieve was changed again. After 66 hours' continuous reflux, the mixture was cooled and filtered to remove suspended solid. The filtrate was washed five times with 200 ml portions of N NaOH solution (i.e., until the NaOH solution was colourless after washing), and then it was washed with water and dried over anhydrous $MgSO_4$. Removal of the solvent gave 4-(methoxymethoxy)benzaldehyde (47 g) as a light brown oil. This was used without further purification.

A small sample was purified by vacuum distillation, b.pt. 85°–6°, 0.25 Torr.

(b) 4,4'-Di(methoxymethoxy)benzoin

A mixture of 4-(methoxymethoxy)benzaldehyde (47 g) and potassium cyanide (6.5 g) in water (40 ml) and ethanol (52 ml) was refluxed with stirring for 2½ hours. The resulting solution was cooled and poured into a solution of ammonium sulphate (300 g) in water (600 ml). The mixture was extracted with diethyl ether, and the ethereal solution was washed twice with water and dried over anhydrous $MgSO_4$. Removal of the ether by distillation left 40 g of a light-brown oil. Thin layer chromatography showed this oil to consist of unreacted 4-(methoxymethoxy)benzaldehyde and 4,4'-di(methoxymethoxy)benzoin. The desired product was isolated by pouring the oil into an ice-cooled mixture of water (1900 ml) and ethanol (400 ml), filtering off the precipitated white solid (19 g) and drying it. Thin layer chromatography showed the solid to be almost entirely 4,4'-di(methoxymethoxy)benzoin and the filtrate to contain 4-(methoxymethoxy)benzaldehyde with only a trace of 4,4'-di(methoxymethoxy)benzoin.

A sample of the product was recrystallised from ethanol. Analysis: C, 65.46%, $C_{18}H_{20}O_6$ requires C, 65.47%. M.pt. 83.5°–84° (H. Kunimoto, Nippon Kagaku Zasshi 1963, 84 (1), 60–4, reports a m.pt. of 75°–6°).

(c) 4,4'-Dihydroxybenzoin 4,4'-Di(methoxymethoxy)benzoin (26 g) was dissolved in a mixture of water (250 ml) and ethanol (250 ml) at 80°. Concentrated hydrochloric acid (2.6 g) was added, and the solution was stirred at 80° for 45 minutes. Then it was cooled and a solution of sodium bicarbonate (2.6 g) in water (50 ml) was added. The reaction mixture was poured into water (600 ml) saturated with ammonium sulphate, and the resulting mixture was extracted with ether. The ethereal solution was dried over anhydrous $MgSO_4$, and removal of the ether by distillation left 19 g of a dark red solid. Thin layer chromatography of this showed it to be substantially 4,4'-dihydroxybenzoin by comparison with an authentic sample (see later), and the material was used without further purification.

Procedure II (a) 4,4'-Dihydroxybenzil

This was prepared following the method described by Leonard et al. in J. Amer. Chem. Soc., 1949, 71, 2997.

Anisil (6.5 g), made by the oxidation of anisoin with copper sulphate in pyridine, was added to acetic acid (50 g) and heated to reflux to form a solution. Hydrobromic acid (s.g. 1.48) was added at reflux until anisil just started to precipitate (about 30 ml HBr being needed). After 2 hours' reflux, more hydrobromic acid (50 ml) was added, and the solution was refluxed for a further 2 hours. After this time, thin layer chromatography showed complete conversion into a single product. The solution was poured into cold water (600 ml) to precipitate a white solid. This was filtered off, washed with water and dried to give 5.5 g of 4,4'-dihydroxybenzil. This was used without further purification.

(b) 4,4'-Dihydroxybenzoin

Concentrated hydrochloric acid (12.5 ml) was added to a vigorously stirred suspension of 4,4'-dihydroxybenzil (5.0 g) and tin (200 mesh, 2.75 g) in water (250 ml) at 70°. After a few minutes a clear solution had formed. After a total reaction time of 8 minutes, the solution was filtered while hot. Ammonium sulphate (50 g) was added to the filtrate; on cooling, a white solid precipitated. This was filtered off, washed with water and dried to give 3.8 g of product. Thin layer chromatography showed this to be substantially 4,4'-dihydroxybenzoin, and it was used without further purification. A small sample recrystallized from water had M.p. 176°–177° C.

III n-Butylation of 4,4'-Dihydroxybenzoin 4,4'-Dihydroxybenzoin (18 g) was dissolved in a mixture of n-butanol (250 ml) and xylene (125 ml), and the solution was heated to reflux under a Dean-Stark head. Toluene-4-sulphonic acid (1.2 g) was added, and the mixture was refluxed for 45 minutes, by which time no more water was separating in the trap. The solution was cooled, washed with water, dilute sodium bicarbonate solution, and again with water, and then dried over anhydrous MgSO$_4$. Removal of the solvent gave 19 g of a dark oil. The product was purified by adding toluene (350 ml) and heating to reflux to form a clear, light-coloured solution. The solution was decanted from a small amount (about 1.5 g) of tarry residue: on cooling, a white crystalline solid precipitated. This was filtered off and dried to give 13.5 g of 4,4'-dihydroxybenzoin n-butyl ether, M.p. 164°–5°. Analysis: C, 71.81; C$_{18}$H$_2$O$_4$ requires C, 72.00.

Solution A

A solution of 4,4'-dihydroxybenzoin n-butyl ether (3.0 g), 1,4-butanediol diglycidyl ether (epoxide content 8.64 equiv./kg, 2.85 g) and N-benzyldimethyldimethylamine (0.03 g) in 2-ethoxyethanol (12 g) was stirred at 130° for 2½ hours, by which time the epoxide content of the solute had fallen to 0.80 equiv./kg. This solution of an advanced epoxide resin is hereinafter called "Solution A".

Solution B

A solution of 4,4'-dihydroxybenzoin n-butyl ether (3.0 g), bisphenol A diglycidyl ether of epoxide content 5.2 equiv./kg (4.3 g) and N-benzyldimethylamine (0.03 g) in 2-ethoxyethanol was stirred at 130° for 2 hours, by which time the epoxide content of the solute had fallen to 0.35 equiv./kg. This solution of an advanced epoxide resin is "Solution B".

Solution C

N,N'-Diglycidyl-5,5-dimethylhydantoin of epoxide content 7.88 equiv./kg (3.0 g), 4,4-dihydroxybenzoin n-butyl ether (3.4 g) and N-benzyldimethylamine (0.02 g) were dissolved in 2-ethoxyethanol (15 g) and stirred at 135° C. for 2 hours, by which time the epoxide content of the solute had fallen to 0.65 equiv.kg. This solution of an advanced epoxide resin is "Solution C".

Solution D 3,3'-Dihydroxybenzoin, prepared as described in U.S. Pat. No. 4,001,216 (3.5 g), 1,4-butanediol diglycidyl ether (epoxide content 8.64 equiv./kg, 3.2 g) and N-benzyldimethylamine (16 g) were dissolved in 2-ethoxyethanol (16 g) and stirred at 120° for 3½ hours, by which time the epoxide content of the solute had fallen to 0.34 equiv./kg. This solution of an advanced epoxide resin is "Solution D".

Solution E

A solution of triethylamine (2.2 g) in dry cyclohexanone (5 g) was added dropwise to a stirred solution of 4,4'-dihydroxybenzoin n-butyl ether (4.0 g) and freshly distilled adipoyl chloride (2.2 g) in dry cyclohexanone (15 g) at 80°. The mixture was stirred for ½ hour at 80° after the addition, and then cooled to room temperature and the amine salt was filtered off. The filtrate, a solution of a polyester, is hereinafter referred to as "Solution E".

Solution F 4,4'-Bis(ethoxycarbonyl)benzoin ethyl ether was prepared from methyl p-formylbenzoate employing the method described in U.S. Pat. No. 3,728,377, involving a benzoin condensation followed by simultaneous etherification and transesterification with ethanol/hydrogen chloride. A polyester was prepared by heating for 1 hour 25 g of this ether with 12.1 g of triethylene glycol in the presence of 0.04 g of titanium tetrabutoxide at 180° C. with stirring, collecting the ethanol that was liberated, then slowly reducing the pressure to about 15 mm. After the mixture had been heated for 1 hour at 180° C. under a vacuum of about 15 mm no further ethanol was evolved. The polyester remaining was dissolved in 45 g of 2-ethoxyethanol to give "Solution F".

Solution G

A solution of 8.07 g of a commercially available prepolymer of 2,4- and 2,6-di-isocyanatotoluene with polytetrahydrofuran (isocyanate content 9.37%) in toluene (10 g) was added dropwise at 20° C. to 6.29 g of 4,4'-dihydroxybenzoin n-butyl ether in 18.72 g of toluene containing 0.2 g of dibutyltin dilaurate. The mixture was warmed to 60° C. and stirred for 9 hours, at which time the isocyanate content was negligible. Toluene (12.8 g) was distilled off at reduced pressure and replaced by an equal weight of 2-ethoxyethanol so as to form a homogeneous solution, "Solution G".

Solution H

A mixture of 4,4'-dihydroxybenzoin n-butyl ether (5.0 g), 1,4-butanediol diglycidyl ether (epoxide content 8.64 eq./kg, 3.5 g), N,N'-diglycidyl-5,5-dimethylhydantoin (epoxide content 7.88 eq./kg, 1.4 g), tetramethylammonium chloride (0.02 g), and 2-ethoxyethanol (20.0 g) was stirred at 135° C. for 2 hours, by which time the epoxide content of the solute had fallen to 0.70 eq./kg. This solution of an advanced epoxide resin is "Solution H".

Solution 1

A solution of trimellitic anhydride (15.7 g), 2-hydroxyethyl acrylate (10.0 g), hydroquinone (0.1 g), benzoquinone (0.1 g), and N-benzyldimethylamine (0.1 g) in dry cyclohexanone (40 g) was stirred at 100° for 3 hours, by which time the infra-red spectrum of the solution showed only a trace of anhydride; this solution of 1,4-dicarboxy-2-(acryloyloxy)ethylcarbonyloxybenzene is "Solution 1".

Solution 2

A solution of phthalic anhydride (14.8 g), 2-hydroxyethyl acrylate (11.8 g), hydroquinone (0.1 g), benzoquinone (0.1 g), and N-benzyldimethylamine (0.1 g) in dry cyclohexanone (30 ml) was stirred for 5 hours at 95°–100°, by which time the infra-red spectrum of the solution showed only a trace of anhydride. This solution of 2-(acryloyloxy)ethyl hydrogen phthalate is "Solution 2".

Solution 3

A solution of succinic anhydride (10.0 g), 2-hydroxyethyl acrylate (11.6 g), N-benzyldimethylamine (0.2 g), hydroquinone (0.1 g) and benzoquinone (0.1 g) in dry cyclohexanone (30 g) was stirred at 100° for 4 hours, by which time the infra-red spectrum of the solution showed that virtually all the anhydride had reacted. This solution of 2-(acryloyloxy)ethyl hydrogen succinate is "Solution 3".

Solution 4

This was made in the same way as Solution 1 except that instead of cyclohexanone there was used an equal weight of N-methylpyrrolidone.

The solutions were applied to the substrates by spin-coating at 2,000 revolutions per minute.

EXAMPLE 1

A mixture of Solution A (1.0 g) and Solution 1 (0.4 g) was coated onto a copper-clad laminate, and the solvent was allowed to evaporate. The film was irradiated through a negative for 15 minutes using a 500 watt medium pressure mercury lamp at a distance of 23 cm. After irradiation, the image was developed by washing with 0.5% solution of disodium hydrogen phosphate in water at 20°; this removed the exposed areas of the coating. The uncoated copper areas were then etched using an aqueous solution of ferric chloride (60% w/v $FeCl_3$) containing concentrated hydrochloric acid (10% v/v), leaving a good relief image.

EXAMPLE 2

A mixture of Solution A (1.0 g) and Solution 2 (0.4 g) was coated onto a copper laminate and tested as described in Example 1. A good relief image was obtained after 3 minutes' irradiation and development in 0.3% aqueous sodium carbonate.

EXAMPLE 3

A mixture of Solution A (1.0 g) and Solution 3 (0.2 g) was coated onto a copper laminate and tested as described in Example 1. A good relief image was obtained after 1 minute's irradiation and development in 0.1% aqueous sodium carbonate.

EXAMPLE 4

A mixture of Solution B (1.0 g) and Solution 3 (0.2 g) was coated onto a copper-clad laminate and was allowed to dry. The coating was irradiated through a mask under a lamp (80 w per cm) at a distance of 125 mm. A good relief image was obtained after 20 seconds' irradiation and development in 2% sodium hydroxide solution.

EXAMPLE 5

A mixture of Solution C (1.0 g) and Solution 2 (0.4 g) was coated onto a copper-clad laminate and was allowed to dry. The coating was tested as described in Example 4. A good relief image was obtained after 20 seconds' irradiation and development in 2% aqueous sodium carbonate solution.

EXAMPLE 6

A mixture of Solution D (0.5 g) and Solution 3 (0.3 g) was coated onto a copper-clad laminate, allowed to dry, and tested according to Example 4. A good relief image was obtained after 40 seconds' irradiation and development in 2% sodium carbonate solution.

EXAMPLE 7

A mixture of Solution E (0.5 g) and Solution 1 (0.2 g) was applied to a copper-clad laminate and allowed to dry. The coating was tested as described in Example 4. A good relief image was obtained after 20 seconds' irradiation and development in 0.5% aqueous disodium hydrogen phosphate solution.

EXAMPLE 8

A relief image was prepared as described in Example 1. The coating on the unirradiated area was cured by heating at 160° for 2 hours. Before heating, the coating was readily soluble in acetone. The thermally cured coating, however, resisted greater than 20 rubs with a swab soaked in acetone.

EXAMPLE 9

A mixture of Solution C (1.0 g) and 3-butenoic acid (0.30 g) was coated onto a copper-clad laminate and dried by heating at 80° C. for 10 minutes. The coating was irradiated through a mask under a 500 watt medium pressure mercury lamp at a distance of 230 mm. A good relief image was obtained after 5 minutes' irradiation and development in 0.1 N sodium hydroxide solution.

EXAMPLE 10

A mixture of Solution C (1.0 g) and 2-(dimethylamino)ethyl methacrylate (0.30 g) was coated onto a coppr-clad laminate and allowed to dry. The coating was irradiated as described in Example 9. A good relief image was obtained after 5 minutes' irradiation and development in 0.1 N hydrochloric acid.

EXAMPLE 11

A mixture of Solution A (1.0 g) and maleic acid (0.03 g) was coated onto a copper-clad laminate and dried by heating at 80° C. for 10 minutes. The coating was tested as described in Example 1. A good relief image was obtained after 5 minutes' irradiation and development in 0.3% aqueous sodium carbonate solution.

EXAMPLE 12

A mixture of Solution F (0.5 g) and Solution 1 (0.25 g) was coated onto a copper-clad laminate and dried. The coating was tested as described in Example 4. A good relief image was obtained after 10 seconds' irradiation and development in 0.5% aqueous sodium carbonate solution.

EXAMPLE 13

A mixture of Solution G (0.5 g) and Solution 4 (0.25 g) was coated onto a copper-clad laminate and dried by heating at 80° C. for 10 minutes. Irradiation for 10 minutes with radiation from a mercury lamp (30 w per cm) through a negative was followed by development with 1% aqueous sodium carbonate solution. A positive image was obtained.

EXAMPLE 14

A mixture of Solution G (3 g) and 2-(dimethylamino)ethyl acrylate (1 g) was applied to a copper-clad laminate, dried, and irradiated as in Example 13. A positive image was obtained on development with 0.1 M hydrochloric acid.

EXAMPLE 15

An aliquot of a mixture of Solution H (3.0 g), Solution C (1.5 g), and 2-(dimethylamino)ethyl acrylate (1.0 g) was applied to a copper-clad laminate, dried at room temperature, and irradiated as in Example 13. A positive image was obtained on development with 0.1 M hydrochloric acid. After subsequent heating for 1 hour at 120° C. the image withstood two rubs with a cotton wool swab that had been soaked in acetone.

To a further aliquot of the same mixture (2.0 g) was added 0.1 g of n-octyldimethylamine-boron trifluoride complex. This mixture was applied to a copper-clad laminate and subjected to the same processing as the mixture not containing the boron trifluoride complex. This resulted in a positive image that withstood five rubs with the acetone-soaked cotton wool.

What is claimed is:

1. A process for the formation of an image which comprises:
   (1) exposing imagewise to actinic radiation a photoresist composition comprising:
   (a) a film-forming organic material having at least one substituted benzoin group of formula:

$$-[(O)_dOC]_n\underset{-(O)_m}{\underset{|}{\bigcirc}}\overset{R_c^3}{\underset{}{\phantom{X}}}-\underset{O}{\overset{OR^1}{\underset{|}{C}}}-\underset{R^2}{\overset{}{\underset{|}{C}}}-\underset{-(O)_p}{\overset{R_d^3}{\underset{}{\bigcirc}}}[CO(O)_a]_q- \qquad I$$

where:
$R^1$ denotes a hydrogen atom, an alkyl, cycloalkyl, cycloalkylalkyl, or aralkyl group or a group $-(CH_2)_bX$,
$R^2$ denotes a hydrogen atom or an alkyl, cycloalkyl, cycloalkylalkyl, aryl or aralkyl group,
$R^3$ denotes a halogen atom or an alkyl, alkoxy, cycloalkyl, cycloalkylalkyl or phenyl group,
X denotes a halogen atom, an alkoxy group, a phenoxy group, a group $-COOR^4$ or a group $-OOCR^4$,
$R^4$ denotes an alkyl group,
a denotes zero or 1,
b denotes an integer of from 1 to 4,
m denotes zero or 1,
n denotes zero or 1, the sum of (m+n) being 1,
p denotes zero or 1,
q denotes zero or 1, the sum of (p+q) being 1,
c denotes zero or an integer of from 1 to 3, and
d denotes zero or an integer of from 1 to 3; and
   (b) a compound which is polymerisable under the influence of a free radical catalyst to form a higher molecular weight material which is more soluble in a developer than the composition prior to exposure, so that the solubility of the composition in a developer is increased in the exposed portion; and
   (2) treating the composition with a developer to remove the exposed portion.

2. The process of claim 1, in which $R^1$ denotes an alkyl group of 1 to 12 carbon atoms, a cycloalkyl group of 3 to 8 carbon atoms, a cycloalkylalkyl group of 4 to 10 carbon atoms, an aralkyl group of 7 to 16 carbon atoms, or a group $-(CH_2)_bX$, wherein:
X denotes a chlorine or bromine atom, an alkoxy group of 1 to 4 carbon atoms, a group of formula $-COOR^4$, or a group of formula $-OOCR^4$ where $R^4$ is an alkyl group of 1 to 4 carbon atoms, and b is 1, 2, or 3.

3. The process of claim 1, in which $R^1$ denotes a hydrogen atom or an alkyl group of 1 to 4 carbon atoms.

4. The process of claim 1, in which $R^2$ denotes an alkyl group of 1 to 12 carbon atoms, a cycloalkyl group of 3 to 8 carbon atoms, a cycloalkylalkyl group of 4 to 10 carbon atoms, an aralkyl group of 7 to 16 carbon atoms, or an aryl group of 6 to 12 carbon atoms.

5. The process of claim 1, in which $R^2$ denotes a hydrogen atom or an alkyl group of 1 to 4 carbon atoms.

6. The process of claim 1, in which the film-forming material (a) is a polyurethane, a polyamide, a polycarbonate, a polysulfone, a phenoxy resin, an epoxide resin, or a polyester.

7. The process of claim 1, in which the film-forming material (a) is an epoxide resin of formula:

$$\underset{R^7\ R^6\ R^5}{\overset{O}{\overset{/\backslash}{CH}}-C-CH}-E-\underset{R^5\ R^6\ R^7}{\overset{OH}{\underset{|}{CH-C-CH}}}-Z-\underset{R^7\ R^6\ R^5}{\overset{OH}{\underset{|}{CH-C-CH}}}-E- \qquad III$$

$$\underset{R^7\ R^6\ R^5}{\overset{O}{\overset{/\backslash}{CH}}-C-CH}\left[-E-\underset{R^5\ R^6\ R^7}{\overset{OH}{\underset{|}{CH-C-CH}}}-Z-\underset{R^7\ R^6\ R^5}{\overset{OH}{\underset{|}{CH-C-CH}}}\right]_{2e} \qquad I$$

where:
E denotes the residue of a diepoxide after removal of two groups of formula:

$$-\underset{R^5\ R^6\ R^7}{\overset{O}{\overset{/\backslash}{CH-C-CH}}} \qquad IV$$

the residue being linked through oxygen, nitrogen or sulfur atoms to the indicated carbon atoms,
Z denotes a group of formula I where a denotes 1, either $R^5$ and $R^7$ each denote a hydrogen atom, in which case $R^6$ denotes a hydrogen atom or a methyl group, or $R^5$ and $R^7$ together represent —$CH_2CH_2$—, in which case $R^6$ denotes a hydrogen atom, and e denotes zero or an integer of from 1 to 50.

8. The process of claim 1, in which the film-forming material (a) is a polyester obtained by reaction of a compound of formula:

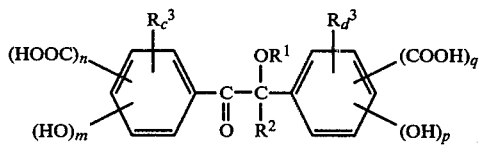

where $R^1$, $R^2$, $R^3$, x, and y have the meanings assigned in claim 1, with, when m and p each denote 1 and n and q each denote zero, with an aliphatic dicarboxylic acid or an ester-forming derivative thereof, or, when n and q each denote 1 and m and p each denote zero, or an ester-forming derivative of such a dicarboxylic acid, with a dihydric alcohol or a dihydric phenol.

9. The process of claim 1, in which the film-forming material (a) is a polyurethane obtained by reaction of a compound of formula:

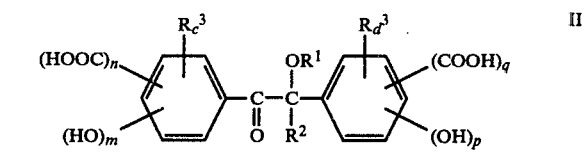

where $R^1$, $R^2$, $R^3$, x, and y have the meanings assigned in claim 1, m and p each denote 1, and n and q each denote zero, with an aliphatic, cycloaliphatic, aromatic, araliphatic, or heterocyclic-aliphatic di-isocyanate or a prepolymer thereof.

10. The process of claim 1, in which (b) is polymerisable to form a higher molecular weight material which is soluble in an aqueous alkaline developer.

11. The process of claim 1, in which (b) is polymerisable to form a higher molecular weight material which is soluble in an aqueous acidic developer.

12. The process of claim 10, in which (b) contains an ethylenically unsaturated group and at least one carboxyl group.

13. The process of claim 12, in which the said ethylenically unsaturated group is an acryloyloxy or methacryloyloxy group.

14. The process of claim 11, in which (b) contains an ethylenically unsaturated group and at least one amino group.

15. The process of claim 14, in which (b) is an alkylaminoalkyl acrylate, an alkylaminoalkyl methacrylate, a dialkylaminoalkyl acrylate, a dialkylaminoalkyl methacrylate, or a vinylpyridine.

16. The process of claim 1, in which the said composition comprises at least 1 mole of (b) per group of formula 1 in (a).

* * * * *